United States Patent
Teshirogi et al.

Patent Number: 5,984,524
Date of Patent: Nov. 16, 1999

[54] APPARATUS AND METHOD FOR TESTING PRODUCT HEAT-RESISTANCE

[75] Inventors: Shoichi Teshirogi; Kenichi Ooeda, both of Kanagawa, Japan

[73] Assignee: Fujitsu Limited, Kawasaki, Japan

[21] Appl. No.: 08/942,694

[22] Filed: Sep. 29, 1997

[51] Int. Cl.$^6$ ................................................ G01N 25/72
[52] U.S. Cl. .................................................. 374/55; 374/5
[58] Field of Search ............................. 374/4, 5, 15, 43, 374/45, 53, 55, 56, 57

[56] References Cited

U.S. PATENT DOCUMENTS

| | | | |
|---|---|---|---|
| 5,052,816 | 10/1991 | Nakamura et al. | 374/5 |
| 5,209,569 | 5/1993 | Fujiwara et al. | 374/55 |
| 5,246,291 | 9/1993 | Lebeau et al. | 374/5 |
| 5,251,476 | 10/1993 | Gilmore et al. | 374/55 |
| 5,350,899 | 9/1994 | Ishikawa et al. | 374/55 |
| 5,396,068 | 3/1995 | Bethea | 374/5 |
| 5,528,151 | 6/1996 | Perez | 374/56 |

FOREIGN PATENT DOCUMENTS

| | | |
|---|---|---|
| 62-190476 | 8/1987 | Japan . |
| 3-124042 | 5/1991 | Japan . |
| 6-130121 | 5/1994 | Japan . |
| 8-15238 | 1/1996 | Japan . |

*Primary Examiner*—G. Bradley Bennett
*Attorney, Agent, or Firm*—Armstrong, Westerman, Hattori, McLeland and Naughton

[57] ABSTRACT

Test apparatus heats or cools a small chamber according to a given thermal profile based on data from a thermal sensor; and the change of a component put in the chamber is measured in real time by a measuring sensor and the relationship between temperature and change in shape is displayed as its measurement results.

21 Claims, 11 Drawing Sheets

TRANSITION OF PACKAGE INFLATION
IN THE CASE OF HUMID SAMPLE (85°C, 85%, 24H)

APPARATUS AND METHOD FOR TESTING PRODUCT HEAT-RESISTANCE

BACKGROUND OF THE INVENTION

1. Field of the Invention

The present invention relates to an apparatus and method for quantitatively measuring influence on a product, such as a device or component, by temperature when some temperature stress is applied to the product in a process for manufacturing or using it.

2. Description of the Related Art

Recently in the semiconductor component field packages are getting larger due to a multi-pinned component and getting thinner due to a lighter, thinner miniature device on which a component is mounted. Especially in the case of a surface-mounted component a product package cannot resist thermal stress at the time of reflow and a thinner package is one factor in increased quality failures such as lower reliability and poor soldering.

FIG. 1A shows the conventional test method for checking the change of a surface mounted component at the time of reflow. Conventionally the change of the component is checked by visually inspecting a swelling, crack or distortion left on measured component 2, scanning them with supersonic waves and measuring their dimensions after some thermal stress is applied in a reflow furnace 1, because there is no technology for measuring the change of the component while heating or cooling it. In reflow furnace 1, a different temperature distribution can be set in different positions and a thermal change can be given to components moving in the furnace. For the dimension measurement instrument 3 instruments such as a micrometer and calipers are used.

However, there are the following shortcomings in the conventional test method:

In the conventional method the change of component 2 is checked after a thermal stress is applied. However, when component 2 is actually mounted on a printed circuit board using reflow furnace 1, it is considered that component 2 transitionally undergoes a complicated change in shape according to the internal evaporation volume of component 2, the strength of component 2 and the applying conditions of heat.

On the other hand, a clearance between the bottom of a package and a printed circuit board in component 2 is smaller due to the development of a thinner package and when the dimensions of the package bottom exceeds this clearance due to a transitional transformation by heat, the lead wires of component 2 ark floated; and solder is not sufficiently applied to the lead wires and it is expected that this poor soldering causes a failure.

FIG. 1B shows such a virtual inflation at the bottom of the package. In this case when a portion below the integrated circuit chip (IC) 4 in component 2 expands and protrudes downwards from the end of the lead wire even for an instant, a failure due to poor soldering occurs. However, when the package shrinks and restores within the clearance after the reflow, only poor soldering remains and its cause cannot be specified. Therefore, in the conventional method it is difficult to ascertain whether there are any problems.

SUMMARY OF THE INVENTION

It is an object of the present invention to provide a test apparatus and method for quantitatively grasping in real time the influence of such thermal stress on a component.

In the first aspect of the present invention the test apparatus is provided with a thermal application unit and a measuring unit. The thermal application unit applies thermal stress to a product, such as a semiconductor component, in an arbitrary thermal profile, including an arbitrary high temperature zone. The measuring unit measures the change in shape of the product due to the applied thermal stress.

In the second aspect of the present invention the test apparatus is provided with a thermal application unit and a measuring unit. The thermal application unit applies thermal stress to a semiconductor component in a thermal profile similar to its state at the time of reflow. The measuring unit measures the influence of the applied thermal stress on the component.

The thermal profile means the characteristics of the thermal change in which its temperature is expressed as a function of time. For example, the thermal application unit consists of a small chamber with a small thermal capacity and a heating/cooling unit. Then a product can be heated or cooled according to an arbitrary profile including a thermal stress profile applied to the component at the time of reflow.

The measuring unit measures the change in shape such as a swelling or distortion, of the product quantitatively in an arbitrary measuring method such as a laser displacement meter, camera or contact pin. The transitional transformation of the product, when a thermal stress is applied, can be recorded by data-processing an obtained transformation volume and outputting it as a result.

DESCRIPTION OF THE PREFERRED EMBODIMENT

The detailed preferred embodiment of the present invention is explained below referring to drawings.

Figure 1A:
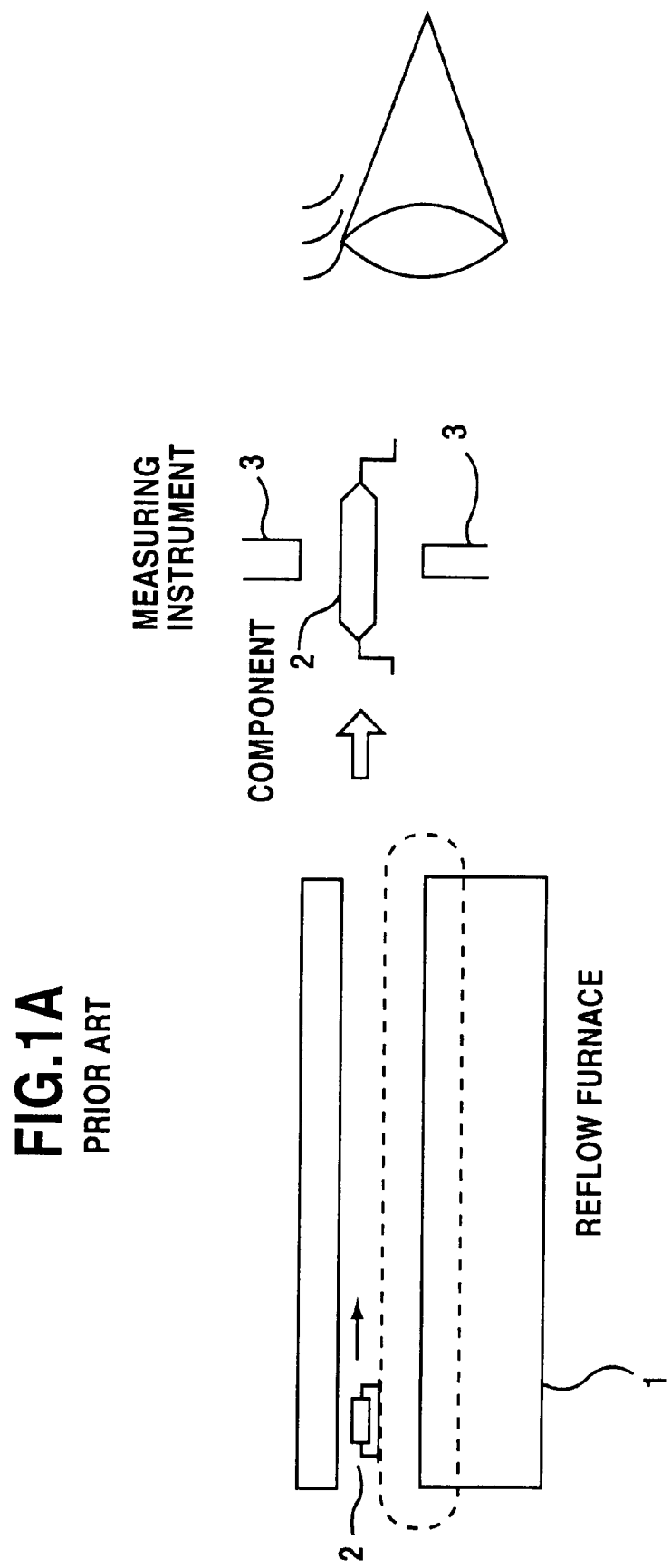
FIG. 1A shows the conventional test method.
Figure 1B:
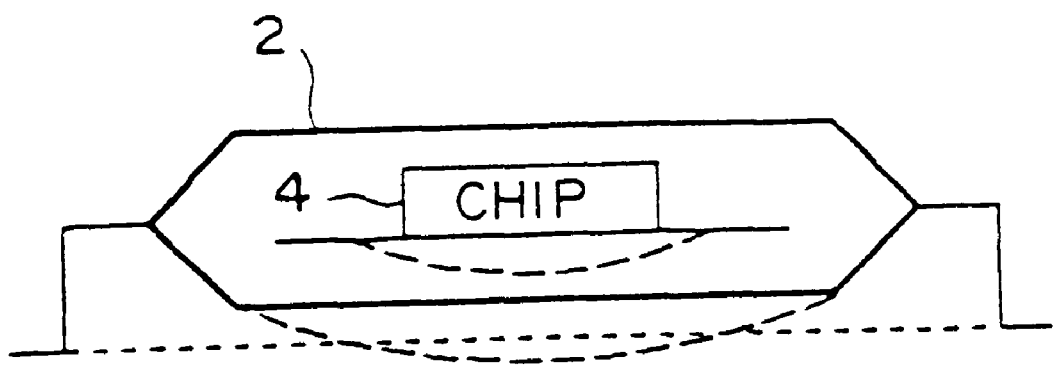
FIG. 1B shows the swelling of the component.
Figure 2A:
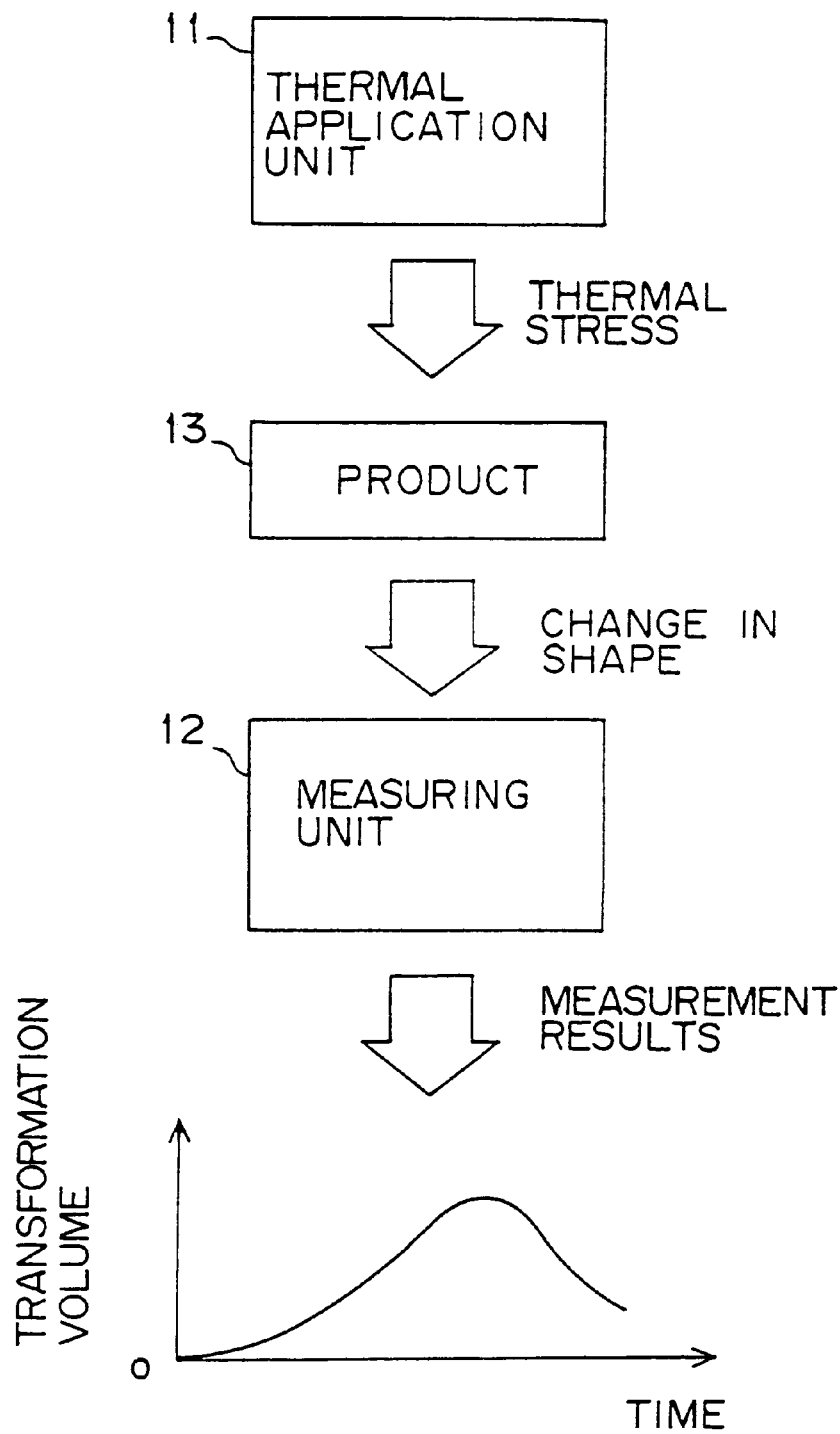
FIG. 2A is the principle diagram of a test apparatus according to the present invention.

FIG. 2A is the principle diagram of a test apparatus according to the present invention. This test apparatus in FIG. 2A is provided with thermal application unit 11 and measuring unit 12. Thermal application unit 11 applies thermal stress to product 13 such as a semiconductor component in an arbitrary thermal profile, including an arbitrary high temperature zone. Measuring unit 12 measures the change in shape of product 13 due to the applied thermal stress.

The thermal profile means the characteristics of the thermal change in which its temperature is expressed as a function of time. For example, thermal application unit 11 consists of a small chamber with a small thermal capacity and a heating/cooling device. Then a product can be heated or cooled according to an arbitrary profile, including a thermal stress profile applied to the component at the time of reflow.

Measuring unit 12 measures the change in shape, such as a swelling or distortion of the product, quantitatively in an arbitrary measuring method, such as a laser displacement meter, camera or contact pin. The transitional transformation of product 13 when thermal stress is applied can be recorded by data-processing an obtained transformation volume and outputting it as a result.

For example, thermal application unit 11 in FIG. 2A corresponds to chamber 31, heating unit 32, cooling unit 33, thermal control unit 34, stage 37 and thermal sensor 38 in FIG. 4, mentioned later, whereas measuring unit 12 corresponds to measuring unit 35 and measuring sensor 39.

Figure 2B:
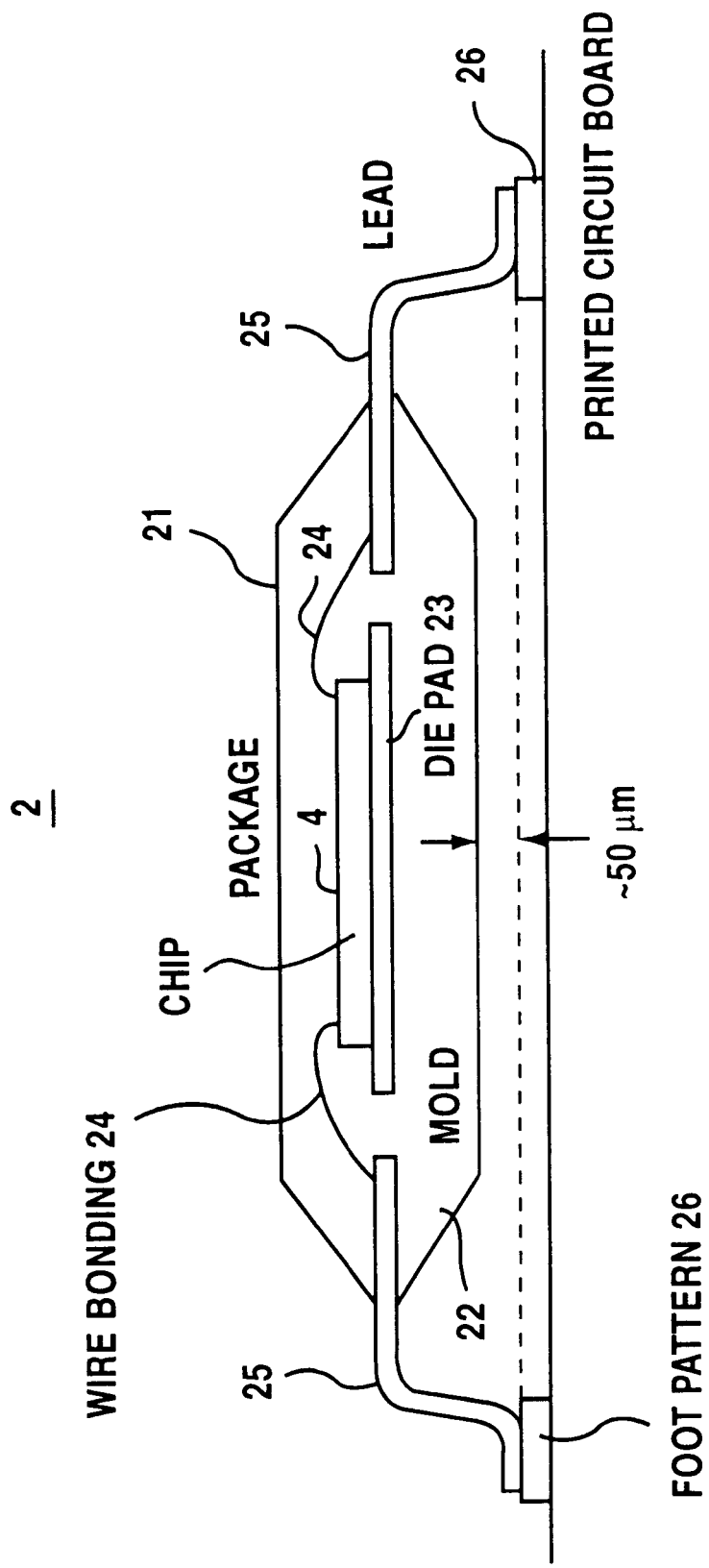
FIG. 2B shows a surface mounted component.

FIG. 2B is the cross-section diagram of the surface mounted component 2. There is a chip (die) 4 mounted on die pad 23 in package 21 of component 2 and its surroundings are covered with mold 22. Although ceramics and plastics are used for mold 22, plastics cheaper than ceramics are more often used.

Chip 4 is connected to lead (terminal) 25 by wire-bonding and the end of lead 25 is fixed on foot pattern 26, on a printed circuit board, by soldering. In a recent component the clearance between package 21 and the top surface of foot pattern 26 is only 50 micro-meters.

At the time of reflow, solder paste is put between foot pattern 26 and lead 25 and soldering is done by heating the solder paste together with the entire printed circuit board and fusing it. At this time the water inside mold 22 evaporates and expands by the thermal stress, and it is considered that an interfacial alienation is caused on the boundary of different materials. The three positions in which an interfacial alienation may occur are the top of chip 4, the boundary between chip 4 and die pad 23, and the bottom of die pad 23.

Figure 3:
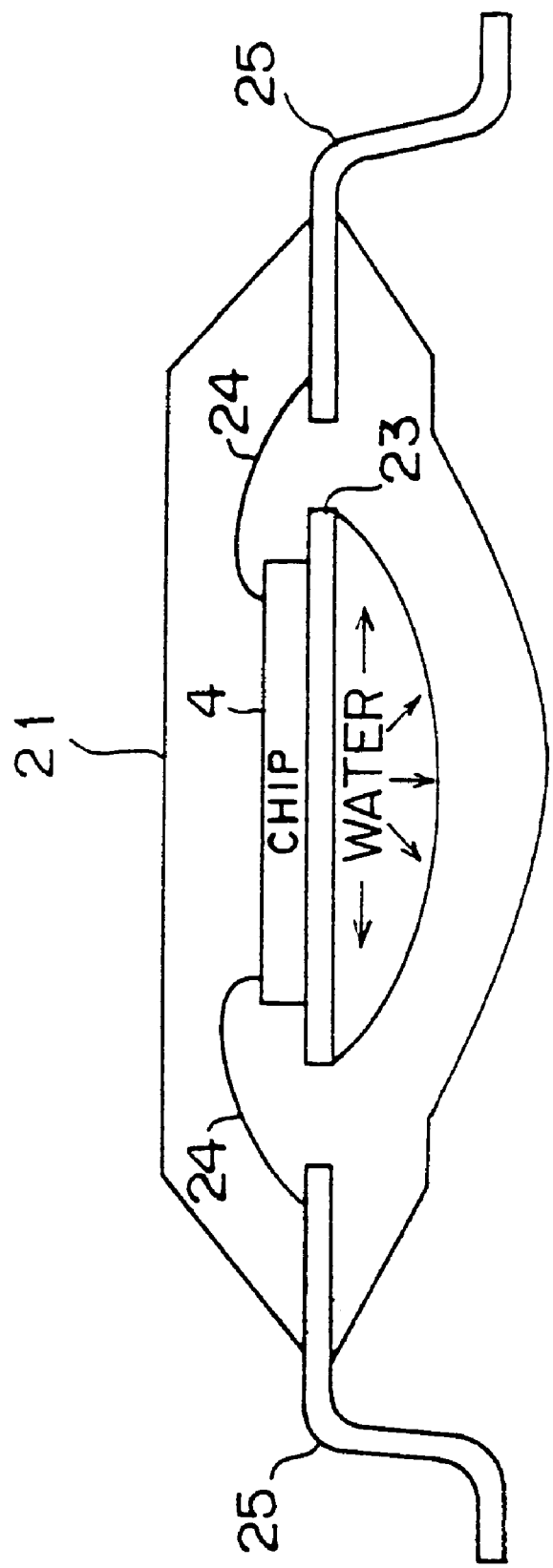
FIG. 3 shows a swelling due to the evaporation swelling of water.

For example, if an interfacial alienation occurs on the bottom of die pad 23, the bottom face (abdomen) of package 21 swells and touches the printed circuit board, as shown in FIG. 3. Accordingly, it is considered that lead 25 is lifted upwards and separates from the solder paste. Therefore, a test apparatus shown in FIG. 4 has been developed to verify that this occurs.

Figure 4:
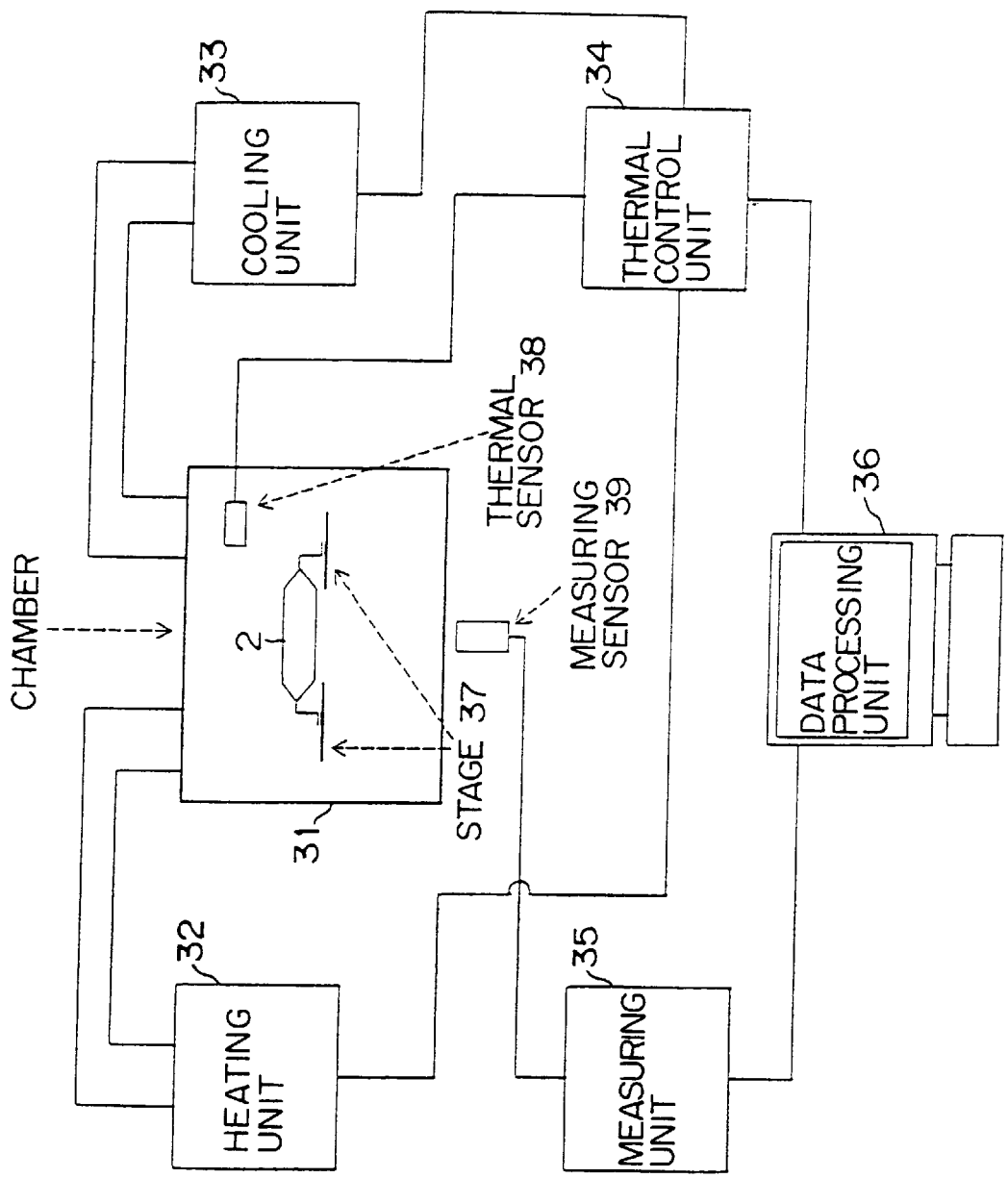
FIG. 4 is the configuration drawing of the test apparatus.

The test apparatus in FIG. 4 is provided with chamber 31, heating unit 32, cooling unit 33, thermal control unit 34, measuring unit 35 and data processing unit 36. Chamber 31 fixes measured component 2 on stage 37 and stores it, whereas heating unit 32 heats chamber 31 according to an arbitrary thermal profile. Cooling unit 33 cools chamber 31 according to an arbitrary thermal profile after heating.

Thermal control unit 34 is connected to thermal sensor 38 in chamber 31, measures the temperature of chamber 31 and component 2 and controls heating unit 32 and cooling unit 33 in order to realize a given profile. For example, thermal stress is applied to component 2 in a thermal profile similar to its state at the time of an actual reflow. Measuring unit 35 is connected to measuring sensor 39 which catches the change of component 2 in chamber 31 in real time, digitalizes data from sensor 39 and sends them to data processing unit 36.

Data processing unit 36 collects measured data from thermal control unit 34 and measuring unit 35, analyses them, calibrates them and displays them on the screen in real time. Of course there is no problem if part of these elements is eliminated for a specific use.

For measuring sensor 39 any sensor which catches changes in shape can be used. For example, a laser displacement meter is a cheaper one with one measuring point. If it is necessary to catch the worst value of change on the designated face of component 2, you can catch its entire image by a charge coupled device (CCD) camera and process the image.

You can also use a mechanical sensor, such as a contact pin. When the tip of the contact pin is kept in contact with package 21 of component 2, the pin is pressed down as much as package 21 swells.

Thermal sensor 38 measures the temperatures in any position of chamber 31 and components. You can have several of these according to your need and measure the temperatures at several measuring points in chamber 31 and on component 2 at the same time. For its measuring method any method of contact or non-contact type can be used according to its purpose and usage. For example, a thermocouple can be used for a contact type sensor and an infra-red sensor for a non-contact type.

Heating unit 32 is used to apply high temperatures to a medium within chamber 31 or component 2 in an arbitrary method, such as a hot wind and infra-red ray, and according to an arbitrary profile, while cooling unit 33 is used to cool chamber 31 or component 2 under a high temperature according to an arbitrary profile. Although a medium used for heating/cooling can be liquid, normally gas, such as air or nitrogen, is used according to the conditions of a reflow furnace.

For stage 37, on which component 2 is mounted, materials similar to the conditions when mounting component 2 on a printed circuit board are used, and its structure and method for mounting/fixing component 2 shall be as similar to the conditions as possible. Thus the influence of thermal stress on component 2 can have characteristics similar to its state at the time of an actual reflow.

For example, in the case of semiconductor components it is recommended that glass-epoxy resin, same as a printed circuit board, is used for materials and component 2 is just put on stage 37. It is recommended that clamps not be used to fix a component, if possible. If material different from the printed circuit board or a clamp is used, the thermal capacity of the component changes and its exact temperature cannot be measured.

It is necessary that stage 37 is structured so that the transformed points of a component do not touch stage 37 and that they do not affect its measurement. For example, when there is a swelling on the bottom of a semiconductor component, it is recommended to make a hole of suitable size in the center of stage 37 in order to prevent the swelling from touching it; or you can create sufficient distance between the surface of stage 37 and component 2.

For data processing unit 36 any data processing unit, such as a workstation and personal computer, can be used, and it collects and analyzes data sent from measuring unit 35 and thermal control unit 34.

When you want to remove a very small transformation (swelling or shrinking) of a part other than component 2 due to heat and the influence on that part by the difference of temperature, you can calibrate a measured value by deducting from it a value measured beforehand. For example, if a dummy component, such as a metal which is hard to transform, is put in place of component 2 and its shape and temperature is measured beforehand, a calibration can be made by deducting these values from the measured values for shape and temperature when testing component 2.

Data processing unit 36 prepares graphs showing the transition of its transformation volume against time and temperature, and displays them on the screen. Instead of displaying them on the screen you may output them using printers or plotters.

Figure 5:
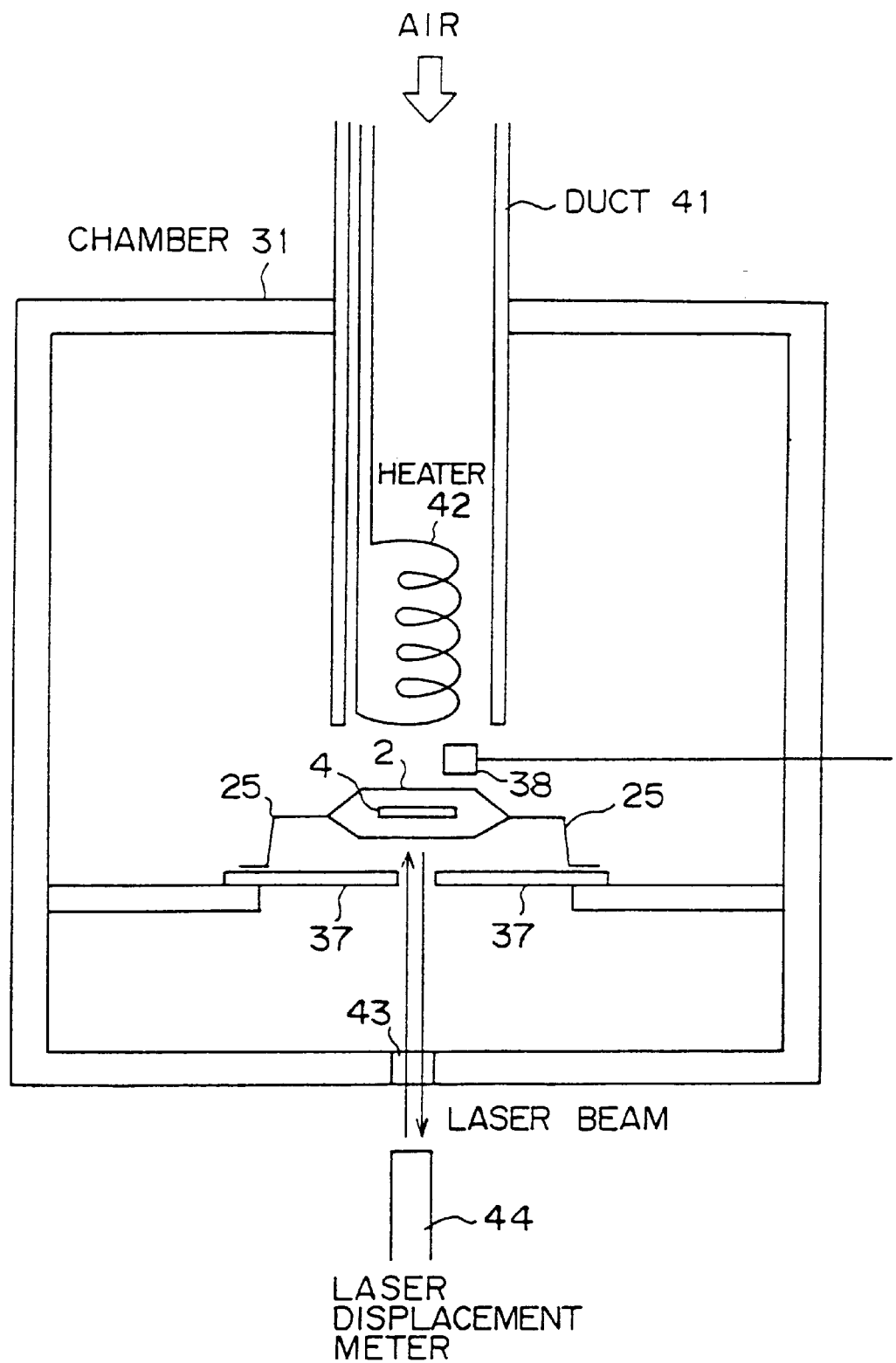
FIG. 5 shows the chamber.

FIG. 5 shows the example of chamber 31 when laser displacement meter 44 is used for measuring unit 39. Chamber 31 in FIG. 5 is provided with duct 41 which is connected to heating unit 32 and cooling unit 33, and duct 41 is provided with heater 42. When heating, heater 42 generates heat and hot air is sent to chamber 31 under the control of heating unit 32. When cooling, heater 42 stops generating heat and cool air is sent to chamber 31.

Since it is necessary to heat and cool component 2 rapidly to realize the thermal profile at the time of an actual reflow, it is needed to reduce the thermal capacity of chamber 31 sufficiently. For this purpose, glass (the thermal capacity of which is relatively small) is desirable as a material of chamber 31. For size one with less than 20cm on each edge is desirable.

For example, although stage 37 is usually made of glass-epoxy resin, it is desirable to use the printed circuit board itself, on which component 2 is mounted, for stage 37. To prevent component 2 from moving when component 2 is put on stage 37 you can fix lead 25 to stage 37 temporarily with heatproof tape. For the material of the tape an adhesive material on which a glass fiber or metallic foil (copper foil, aluminum foil, etc.) is spread over is used. There is a hole in stage 37 so that swollen component 2 does not touch it.

The bottom of chamber 31 is provided with glass window 43 aligned with the hole of stage 37 and the laser beam applied from laser displacement meter 44 reaches the bottom of component 2 through this window. At this time the distance to component 2 can be obtained from the time required for the applied laser beam to reflect on the bottom of component 2 and return to displacement meter 44, thereby the change in shape of the bottom of component 2 is measured.

On the other hand, when measuring its change in shape with a CCD camera, a glass window is provided in the position corresponding to the height of component 2 on the side instead of the underside of chamber 31. The image of component 2 is taken in through the window and processed. When a contact pin is used, it is not necessary to have such a window.

Although the test method of transformation due to the swelling of a surface mounted component has been explained so far, the change in shape of any products, including other semiconductor components and devices, can be measured using a test apparatus as in FIG. 4. For example, this test apparatus can be used for the measurement of the distortion and change in shape due to the heat of a printed circuit board on which a component is mounted.

Figure 6:
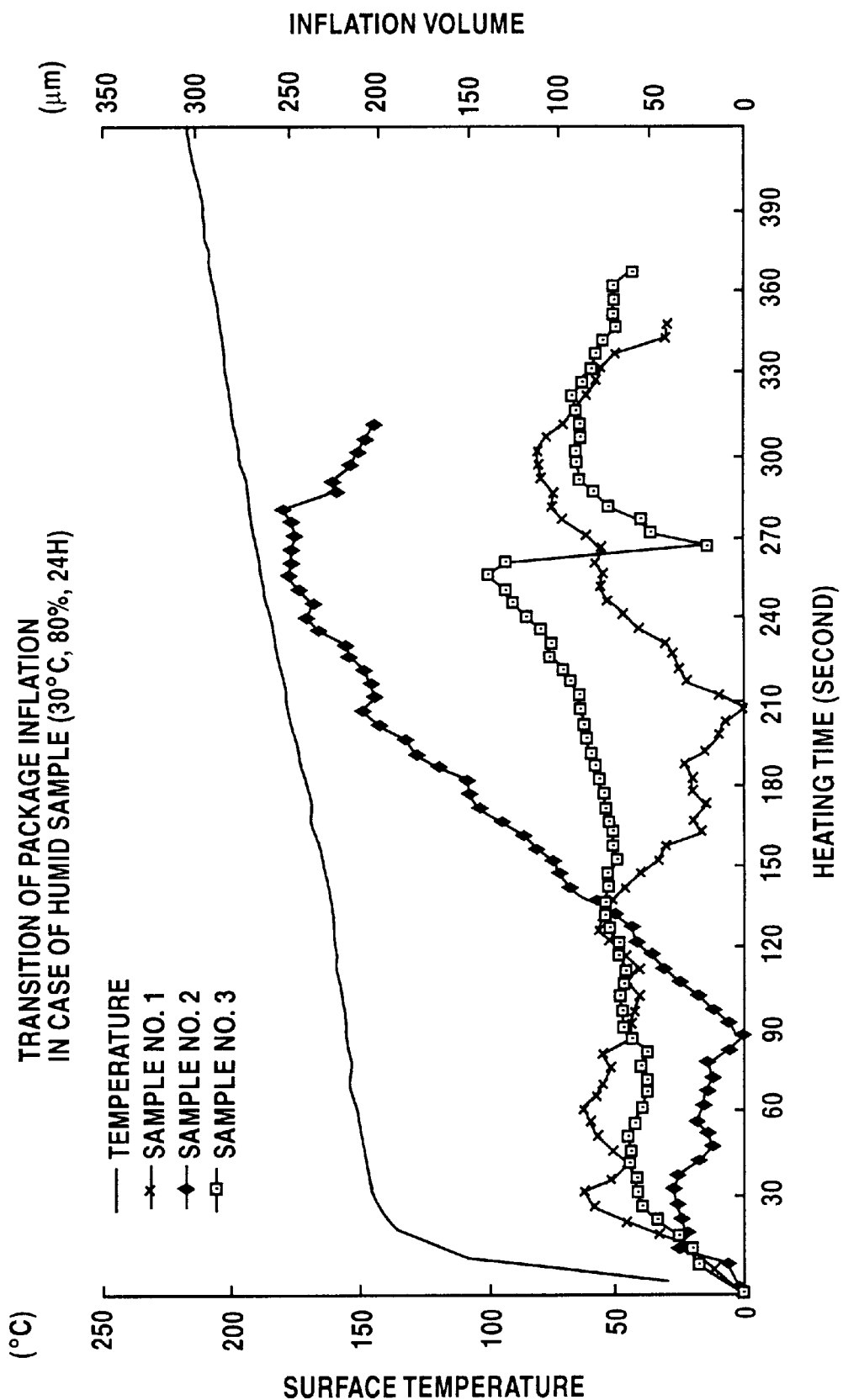
FIG. 6 shows the first measuring result.
Figure 7:
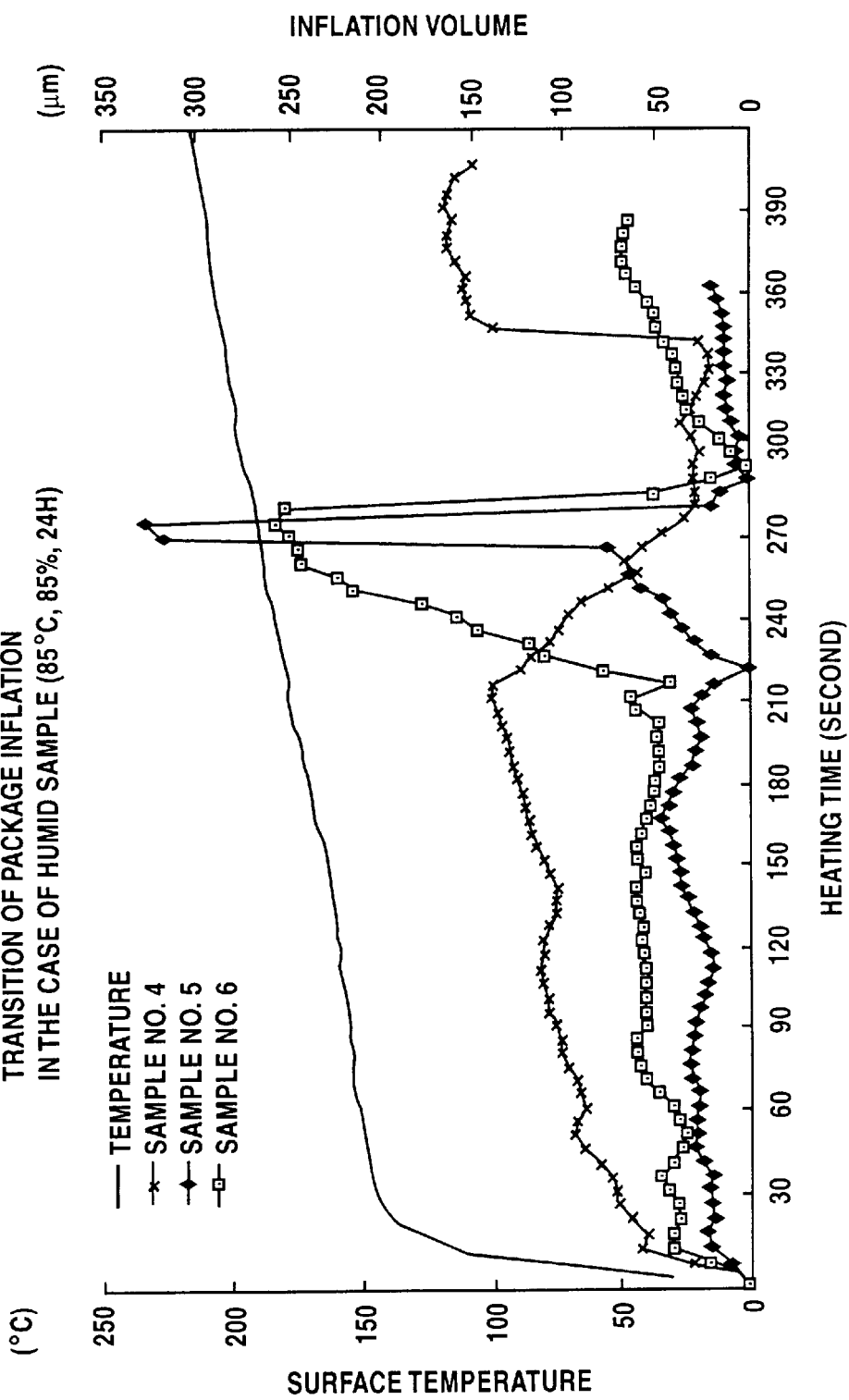
FIG. 7 shows the second measuring result.
Figure 8:
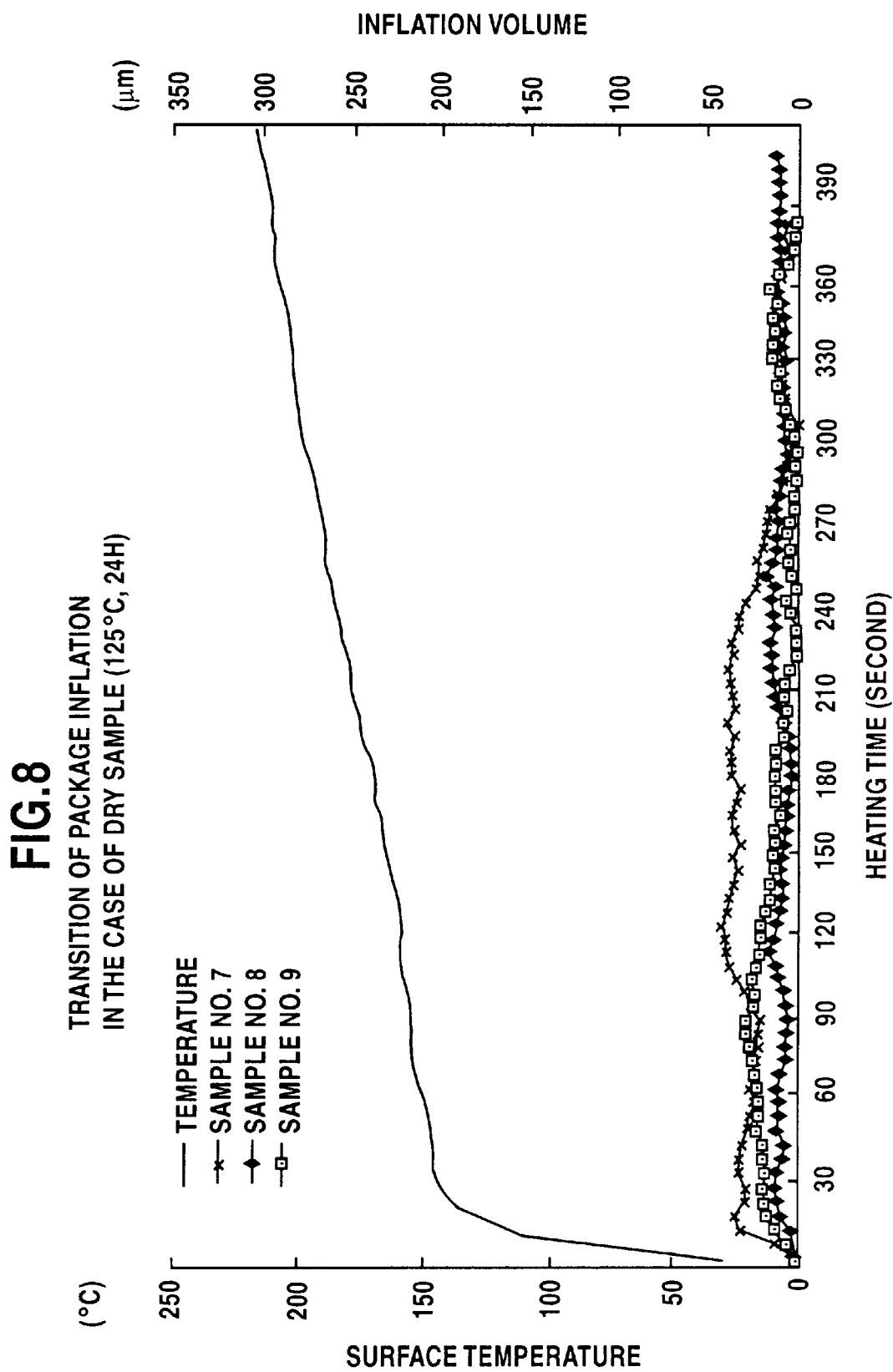
FIG. 8 shows the third measuring result.

FIGS. 6, 7 and 8 show the actual measurement results of the change in shape of the rear of surface mounted components which was obtained using the test device in FIG. 4. In this measurement the surface temperature of a component was measured with a thermal sensor using characteristics of heating gradually up to a high temperature zone around 215 degrees Celsius, which is applied at the time of reflow, for a thermal profile. In the case of this component the clearance between the terminal and the rear of the component is 50 micro-meters and when its inflation volume exceeds this value it becomes a cause of poor soldering.

FIG. 6 shows the result of the test in which three humid samples (No.1, No.2 and No.3) were tested according to the same profile. These samples were left alone for 24 hours under conditions of 30 degrees Celsius and 80% relative humidity after baking them at 125 degrees Celsius for 24 hours. It is seen from FIG. 6 that the swelling volume of each sample varies with time, exceeds 50 micro-meters instantaneously and Sample No.1 swells more than sample No.2 and 3.

Sample No.7 shows the result of the test in which another three humid samples (No.4, No.5 and No.6) were tested according to the same profile as shown in FIG. 6. These samples were left alone for 24 hours under conditions of 85 degrees Celsius and 85% relative humidity after baking them at 125 degrees Celsius for 24 hours. It is seen from FIG. 7 that the inflation volume of samples No.5 and 6 is increasing suddenly after a lapse of about 270 seconds from the start of heating. These samples shrunk after they were broken dye to the inflation of evaporated water.

FIG. 8 shows the result of the test in which three dry samples (No.7, No.8 and No.9) were tested according to the same profile as shown in FIG. 6. For these samples components immediately after baking at 125 degrees Celsius for 24 hours were used. It is seen from FIG. 8 that no inflation volume of the samples exceeds 50 micro-meters. Therefore, although it seems that poor soldering rarely occurs in a component immediately after baking, it is difficult to use baked components because of the limitation in its manufacturing process.

Figure 9:
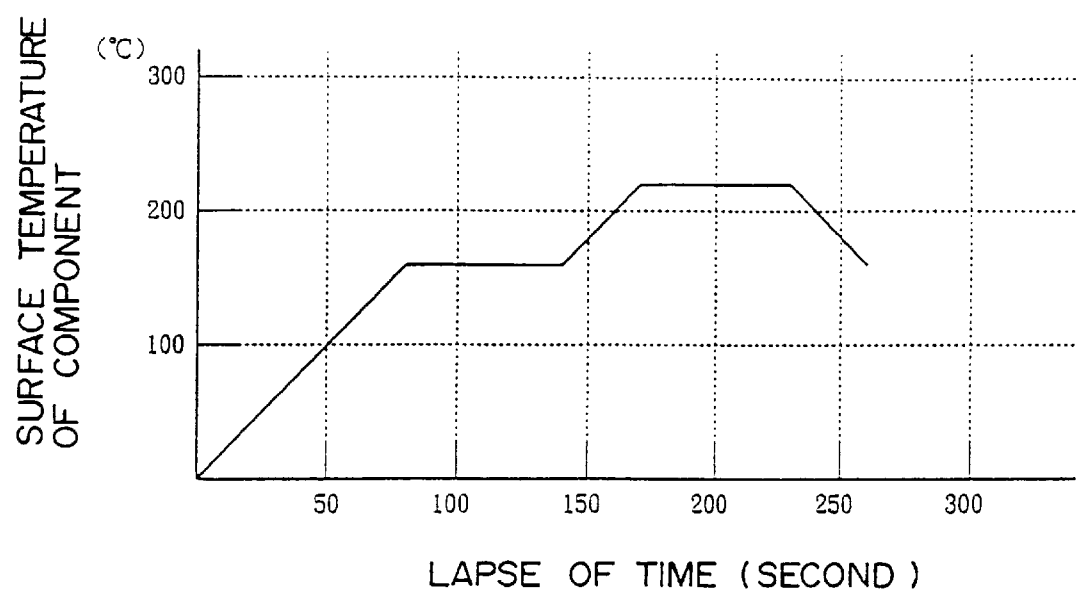
FIG. 9 shows the thermal profile of reflow.

For example, the thermal profile at the time of an actual reflow is shown in FIG. 9. This is a general profile based on the standards of FV523/106 and it indicates that rapid heating and cooling are made in a short time. The change in shape of a component at the time of reflow can be measured exactly by employing this profile at the time of test.

According to the present invention the relationship among time, temperature and transformation volume, when thermal stress is applied to a product, can be exactly measured in real time. Therefore, this invention greatly contributes to the data collection for improving the heat resistance of products, the setting of the most suitable profile for reflow and the improvement of soldering quality. Especially, it is expected that this invention plays a very important role in the package development/assessment and finding mounting conditions of reflow.

What is claimed is:

1. A test apparatus comprising:

a chamber;

means for mounting a product to be tested in said chamber;

thermal application means for applying thermal stress to said product;

means for varying the application of thermal stress to said product by said thermal application means over a period of time;

means for controlling the variations of thermal stress application by said thermal application means to correspond to a predetermined thermal profile; and measuring means for measuring a change in shape of the product due to the applied thermal stress.

2. The test apparatus according to claim 1, wherein said measuring means measures the change in shape of the product due to an inflation of water inside the product when the product is heated.

3. The test apparatus according to claim 2, wherein said measuring means measures an inflation volume of the product due to an inflation of the water on a boundary of different materials inside the product.

4. The test apparatus according to claim 1, wherein said thermal application means cools the product down to a predetermined low temperature zone according to said predetermined thermal profile, and said measuring means measures the change in shape of the product when the product is cooled.

5. The test apparatus according to claim 1 wherein said measuring means measures the transformation volume at a predetermined point of the product in real time.

6. The test apparatus according to claim 1, wherein said chamber has a selected limited thermal capacity.

7. The test apparatus according to claim 6, wherein said thermal application means includes thermal measuring means for measuring a temperature at a selected point in said chamber means.

8. The test apparatus according to claim 7, wherein said controlling means includes means for receiving information on the temperature measured by said thermal measuring means and controlling the temperature at the selected point in said chamber so as to conform to said thermal profile.

9. The test apparatus according to claim 8, wherein said thermal profile includes a predetermined high temperature zone.

10. The test apparatus according to claim 1, further comprising stage means in said chamber for mounting the product.

11. The test apparatus according to claim 10, wherein said stage means defines a space which permits the product with a changed shape to extend without touching said stage means.

12. The test apparatus according to claim 11, wherein said stage means is made of a material for a printed-circuit board.

13. The test apparatus according to claim 1, wherein said product mounting means includes holding means for holding a semiconductor component corresponding to the product in order to realize thermal characteristics similar to a state of the component at a time of reflow heating.

14. The test apparatus according to claim 13, wherein said holding means includes heatproof tape.

15. The test apparatus according to claim 1, further comprising data processing means for collecting data of a transformation volume measured by said measuring means and outputting a measurement result.

16. The test apparatus according to claim 15, wherein said data processing means outputs in real time information of at least one transition out of a transition of the transformation volume against time and a transition of the transformation volume against temperature.

17. The test apparatus according to claim 15, wherein said data processing means stores data showing an influence of the thermal stress on a part other than the product of said test apparatus beforehand and calibrates the measurement result based on the data.

18. A test apparatus, comprising:

a chamber;

means for mounting a semiconductor component in said chamber;

thermal application means for applying thermal stress to said semiconductor component;

means for varying the application of thermal stress to said semiconductor component by said thermal application means;

means for controlling the variation of thermal stress application by said thermal application means to correspond to a thermal profile similar to that to which said component will be subjected at a time of reflow; and measuring means for measuring influence of the applied thermal stress on the component.

19. A test method comprising the steps of:

applying thermal stress to a product according to a predetermined thermal profile including a predetermined high temperature zone, said thermal profile corresponding to that to which said product will be subjected during processing; and measuring a change in shape of the product due to the applied thermal stress.

20. The test method according to claim 19, wherein said product contains moisture, and in the step of measuring, the change in shape of the product due to an inflation of water inside the product is measured when the product is heated.

21. A test method comprising the steps of:

applying thermal stress to a semiconductor component according to a thermal profile corresponding to the thermal profile to which said component will be subjected at a time of reflow heating; and measuring influence of the applied thermal stress on the component.

* * * * *

UNITED STATES PATENT AND TRADEMARK OFFICE
CERTIFICATE OF CORRECTION

PATENT NO. : 5,984,524
DATED : November 16, 1999
INVENTOR(S) : TESHIROGI et al.

It is certified that error appears in the above-indentified patent and that said Letters Patent is hereby corrected as shown below:

On the title page of the patent insert item --[30] Foreign Application Priority Data March 18, 1997 [JP] Japan ...... 9-064024--

Signed and Sealed this

Sixth Day of March, 2001

Attest:

NICHOLAS P. GODICI

Attesting Officer

Acting Director of the United States Patent and Trademark Office